United States Patent
Menezes

(12) 
(10) Patent No.: US 9,571,104 B1
(45) Date of Patent: Feb. 14, 2017

(54) PROGRAMMABLE BODY BIAS POWER SUPPLY

(71) Applicant: TEXAS INSTRUMENTS INCORPORATED, Dallas, TX (US)

(72) Inventor: Vinod Menezes, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/886,242

(22) Filed: Oct. 19, 2015

(51) Int. Cl.
*H03K 19/17* (2006.01)
*H03K 19/177* (2006.01)
*H03K 19/00* (2006.01)
*H03K 17/22* (2006.01)

(52) U.S. Cl.
CPC ...... *H03K 19/17772* (2013.01); *H03K 17/223* (2013.01); *H03K 19/0013* (2013.01)

(58) Field of Classification Search
None
See application file for complete search history.

(56) References Cited

U.S. PATENT DOCUMENTS

| | | | |
|---|---|---|---|
| 6,288,587 B1* | 9/2001 | Chen | G04F 10/00 327/261 |
| 6,529,421 B1* | 3/2003 | Marr | G11C 5/147 327/534 |
| 2008/0158976 A1* | 7/2008 | Sekar | G11C 11/5642 365/185.18 |
| 2008/0197914 A1* | 8/2008 | Shimizu | H03K 19/0013 327/541 |
| 2008/0290911 A1* | 11/2008 | Williams | H03K 17/6872 327/109 |
| 2009/0010035 A1* | 1/2009 | Williams | H02M 3/1582 363/131 |
| 2014/0159806 A1* | 6/2014 | Kim | G05F 3/205 327/537 |
| 2015/0084684 A1* | 3/2015 | Zanetta | H03K 17/08122 327/378 |

* cited by examiner

*Primary Examiner* — Crystal L Hammond
(74) *Attorney, Agent, or Firm* — John R. Pessetto; Charles A. Brill; Frank D. Cimino

(57) ABSTRACT

Methods and apparatus permit body biasing to be controlled for transistors of a logic device. By controlling the body biasing, transistor threshold voltages can be controlled—increased during standby modes of the logic device to reduce leakage current and decreased during active modes and to increase switching speed during the active modes. The change in the body biasing can be made relatively slowly to reduce wasted energy that would otherwise be dissipated as heat. In a method embodiment, the method includes obtaining first and second body bias slope parameters, each slope parameter defining, at least in part, a slope of a body bias voltage signal. The method includes charging a body of a transistor with a bias voltage signal per the first body bias slope parameter to lower a threshold voltage, and discharging the body per the second body bias slope parameter to decrease leakage current of the transistor.

20 Claims, 4 Drawing Sheets

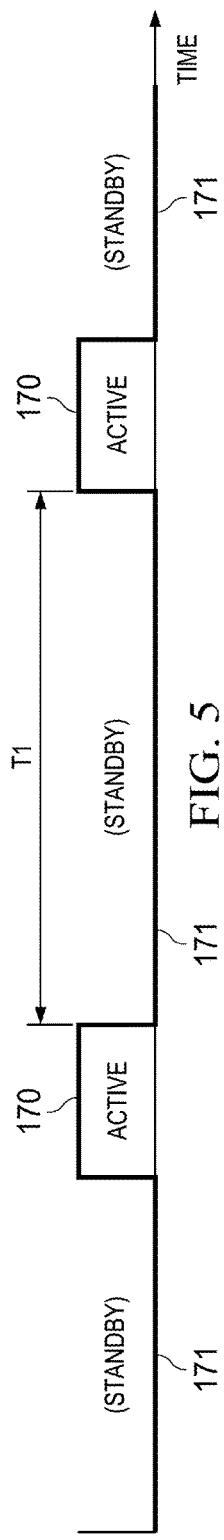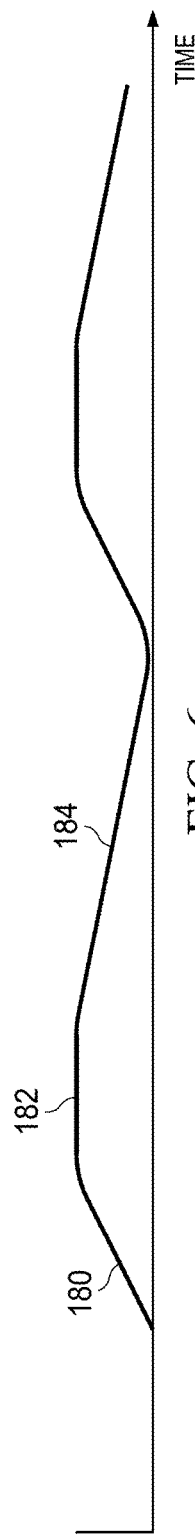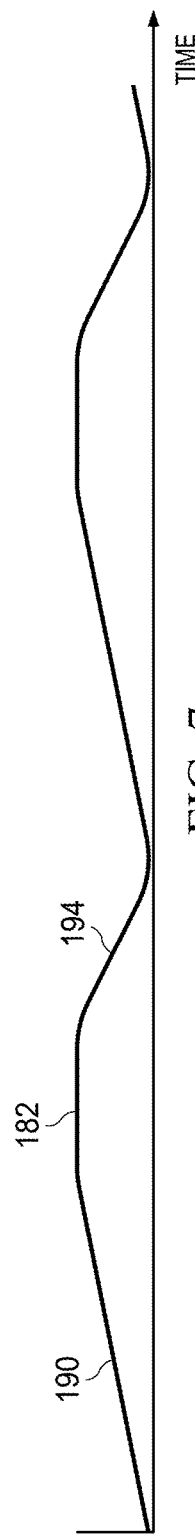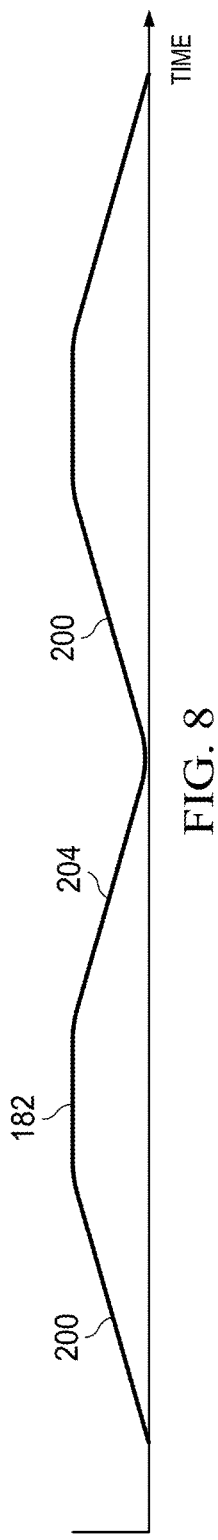

PROGRAMMABLE BODY BIAS POWER SUPPLY

BACKGROUND

Many types of electronic systems include transistors such as complementary metal oxide semiconductor (CMOS) transistors. When such a transistor is turned on and off, a considerable amount of energy is dissipated as heat. Converting electrical energy to thermal energy causes multiple problems. First, converting to electrical energy to thermal energy in most cases is wasteful because thermal energy is not used to perform any useful work. If the system is battery-operated, because some of the energy is converted to a non-useful form, the battery will not last as long as it would had such energy not been wasted, or a larger, more expensive battery is needed to account for such losses. Second, the heat must be removed from the system which may require the use of heat sinks, fans, etc. Such heat dissipation equipment adds size, weight, and cost to the system.

SUMMARY

Disclosed herein are methods and apparatus that permit body biasing to be controlled for transistors of a logic device. By controlling the body biasing, transistor threshold voltages can be controlled—for example, reverse body bias (RBB) and forward body bias (FBB) during standby modes of the logic device to reduce leakage current and decreased during active modes to increase switching speed. The change in the level of body biasing can be made relatively slowly to reduce wasted energy that would otherwise be dissipated as heat.

In a method embodiment, the method includes obtaining first and second body bias slope parameters, each slope parameter defining, at least in part, a slope of a body bias voltage signal. The method includes charging a body of a transistor with a bias voltage signal per the first body bias slope parameter to lower a threshold voltage, and discharging the body per the second body bias slope parameter to decrease leakage current of the transistor.

In another embodiment, a system includes a programmable body bias power supply. The programmable body bias power supply includes storage for body bias waveshape parameters, a controller, and a body bias control network. The system also includes logic coupled to the programmable body bias power supply. The logic includes one or more transistors that include a body connection. The controller is configured to cause the body bias control network to generate a body bias signal to be provided to the body connection of the one or more transistors. A slope of the body bias signal is programmable based on the body bias waveshape parameters stored in the storage.

In yet another embodiment, a programmable body bias power supply includes storage for body bias timing values, a body bias generator, and a controller coupled to the storage and the body bias generator. The controller is configured to retrieve the body bias timing values and to cause the body bias generator to generate a body bias signal to be provided to a body connection of a transistor. A slope of the body bias signal is configured by the controller based on the body bias timing values stored in the storage.

BRIEF DESCRIPTION OF THE DRAWINGS

For a detailed description of various examples, reference will now be made to the accompanying drawings in which:

FIG. 5 shows a timeline of periodic active modes of the logic powered by the programmable body bias power supply in accordance with various examples;

FIG. 6 illustrates a more rapid ramp up of the body bias voltage and a slower dissipation of the body bias voltage in accordance with various examples;

FIG. 7 illustrates a slower ramp up of the body bias voltage and a more rapid dissipation of the body bias voltage in accordance with various examples;

FIG. 8 illustrates a slower ramp up of the body bias voltage as well as a slower dissipation of the body bias voltage in accordance with various examples;

DETAILED DESCRIPTION

Figure 1:
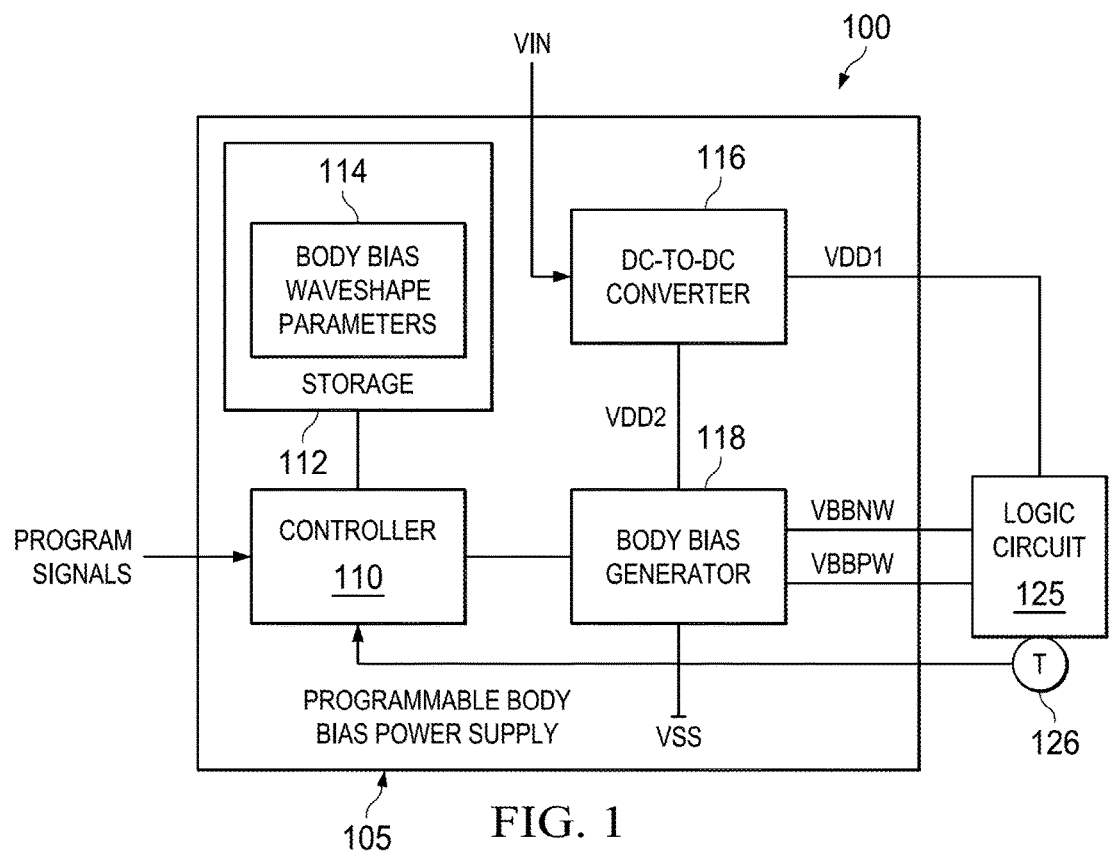
FIG. 1 shows a system including a programmable body bias power supply in accordance with various examples.

References are made herein to CMOS transistors, but the disclosed principles may apply to the operation of logic containing other types of transistors as well. A CMOS transistor can be modeled, in part, as a capacitor (e.g., a capacitor formed from the gate and the channel). The connections to the transistor and internal conductive elements of the transistor are resistive in nature. As such, the CMOS transistor can be modeled as a resistor in series with a capacitor. Turning on the transistor includes stepping the gate voltage from one level to another, such as from ground to a positive voltage level (VDD). In so doing, half of the energy produced by the supply is dissipated in the resistor and the remaining half is stored in the capacitor. The total energy provided by the supply can be calculated as $CV^2$, where C is the capacitance of the capacitor and V is the difference between VDD and ground (i.e., the change in voltage on the gate of the transistor). Thus, $\frac{1}{2}(CV^2)$ is dissipated in the resistor and $\frac{1}{2}(CV^2)$ is stored in the capacitor. When the transistor is subsequently turned off the energy stored in the capacitor is dissipated to ground through resistive elements and thus another $\frac{1}{2}(CV^2)$ is dissipated in the resistive elements. Between the charge and discharge cycles of the capacitor, a total amount of energy equaling $CV^2$ is dissipated in resistive elements and thus wasted as heat.

In an adiabatic process, however, heat is not transferred between the system and its surroundings; that is, energy is only transferred as work. In accordance with the disclosed embodiments and in a manner at least reminiscent of an adiabatic process, a logic circuit is powered and controlled by a power supply in a way that greatly reduces or eliminates energy transfer wasted as heat. The power supply controls the voltage to the body (also called "bulk") connections of the various of the transistors in the logic circuit. The voltage level on the body of a transistor in part determines the threshold voltage of the transistor. Therefore, transistors can be made to turn on faster by adjusting the body voltages to lower the threshold voltage. However, any rapid (e.g., step-wise) adjustments in body biasing causes wasted energy in the form of heat as explained above.

In accordance with the disclosed embodiments, the power supply can slowly ramp up or down the body bias voltages on the transistors of the logic circuit. In the example of a constant current source, energy dissipated in a resistor connected in series with a capacitor is given as:

$$\text{Energy dissipated} = \left(\frac{RC}{T}\right) * C * VDD^2$$

where R is the resistance of the resistor (e.g., the resistance of the interconnection), C is the capacitance of the capacitor (e.g., the capacitor formed between the body and the source of a transistor), T is time and VDD is the voltage to which the capacitor charges in time T. The energy dissipated in the resistor tends to 0 if T>>RC. Thus, the longer T is, the less energy will be dissipated in the resistor and thus wasted.

The disclosed power supply implements this principle to greatly reduce wasted energy dissipation. The power supply is able to relatively slowly ramp up and down the bias voltages to the body connections of some or all of the transistors in the logic circuit. By increasing and/or decreasing the body bias voltages relatively slowly over time, very little if any energy is dissipated as heat and wasted. The disclosed power supply thus may approximate an adiabatic process. This principle can be applied to a variety of applications, but is particularly useful for logic circuits that have relatively long periods of a standby mode in which the logic circuit does very little if anything and then short periods of an active mode in which the logic circuit performs a burst of activity. Many internet-of-things (IoT) devices operate in this manner and benefit from the disclosed embodiments. Sensors that take periodic measurements and then go into a long sleep mode also benefit from the disclosed embodiments. Numerous other types of bursty activity systems, with relatively long intervening periods of inactivity benefit from the disclosed principles. As a result, if the logic circuit is battery-operated, the battery will last longer (e.g., 10 years) and/or a smaller, cheaper battery can be used without loss of battery life.

The disclosed power supply is programmable. The power supply can be programmed to increase the body bias voltages relatively rapidly, but discharge the body bias voltages relatively slowly. Alternatively, the power supply can be programmed to increase the body bias voltages relatively slowly, but discharge the body bias voltages relatively rapidly. Charging/discharging the transistor bodies more quickly reduces the amount of leakage current. Thus, the programmability of the power supply permits a tradeoff to be made between reducing power dissipation in the form of heat and reducing leakage current.

Further still, the power supply can be programmed to increase the body bias voltages relatively slowly, and to discharge the body bias voltages relatively slowly as well. Sensors and interrupts may be included to cause the power supply to adjust the slope of the increase and/or decrease of the body bias voltages. For example, a temperature sensor may sense the temperature of the logic circuit. Changes in temperature of a transistor can cause a change in the threshold voltage of the transistor. Thus, the power supply may automatically adjust the level of the body bias voltages to compensate for changes in temperature.

FIG. 1 shows an example of an implementation of a programmable body bias power supply 105 coupled to a logic circuit 125 (or simply logic). The logic 125 may include complementary metal oxide semiconductor ("CMOS") logic or another type of semiconductor logic, and the logic 125 can perform any desired function. The programmable body bias power supply 105 may provide an operating voltage VDD1 to the logic 125 and also a pair of body bias voltages VBBNW and VBBPW. The VBBNW is the body bias voltage provided to the n-well bodies of one or more p-type metal oxide semiconductor ("pMOS") transistors in the logic 125, and the VBBPW is the body bias voltage provided to p-well bodies of one or more n-type metal oxide semiconductor ("nMOS") transistors.

In the example of FIG. 1, the programmable body bias power supply 105 includes a controller 110, storage 112, a direct current (DC)-to-DC converter 116, and a body bias generator 118. The controller 110 may be a microcontroller, or any other type of device that can implement a state machine. As a controller, the controller 110 executes code stored internally or in storage 112 to impart the functionality described herein for the controller. The storage 112 may include volatile storage (e.g., random access memory) or non-volatile storage (e.g., solid state or magnetic storage). Various body bias wave shape parameters 114 may be stored in storage 112 for subsequent use in generating the VBBNW and VBBPW voltages to the bodies of pMOS and nMOS transistors in the logic circuit 125. The body bias waveshape parameters help define the slope of charging and/or discharging the transistor bodies.

The DC-to-DC converter 116 receives an input voltage supply (Vin) and converts the Vin voltage to one or more output voltages for use in powering the logic circuit 125 and the other components of the programmable body bias power supply 105. In the example of FIG. 1, the DC-to-DC converter 116 generates a VDD1 voltage to power the logic circuit 125 and a VDD2 voltage to power the body bias generator 118. VDD2 may be used to power other circuits within the power supply 105. The particular levels of the VDD1 and VDD2 voltages depend on the particular components to be powered, the desired switching speeds and various other factors. The voltage levels of VDD1 and VDD2 may be the same or different.

The controller 110 can receive programming signals as shown. These signals may be provided to program how the programmable body bias power supply 105 is to wave shape the VBBNW and VBBPW signals. The VBBNW and VBBPW signals can be ramped up or down by the body bias generator, under control by the controller 110 to adjust the threshold voltage of the corresponding transistors in the logic circuit 125. Wave shaping the VBBNW and VBBPW signals may include adjusting the slope at which the signals change over time from one voltage level to another, and the programming signals may define the slopes of the VBBNW and VBBPW signals, or be used to otherwise determine the slopes. The programming signals will vary the time constant of the charge or discharge process. For example, rather than raise the voltage of VBBNW from one level to another in a single step, a small constant current source is used to charge the capacitive load to thereby ramp up the voltage from the one level to the another. The slope (i.e., slew rate) of the voltage on the load capacitor is given by I/C, where I is the magnitude of the current from the current source, and C is the load capacitance. If I is a constant, and if C is a constant, then the slope I/C is a constant. To control the slope, the programming signal may switch multiple of these current sources in parallel. With additional current sources, the faster (greater) the slope will be. If N current sources are used the slope is N*I/C. If only one current source is used, then the slope is 1*I/C. In general, the control signals may select between 1 and N current sources to charge the load VBBNW (or VBBPW). The programming signal may comprise a digital/binary code, but other arrangements are possible as well for the programming signal.

Figure 2:
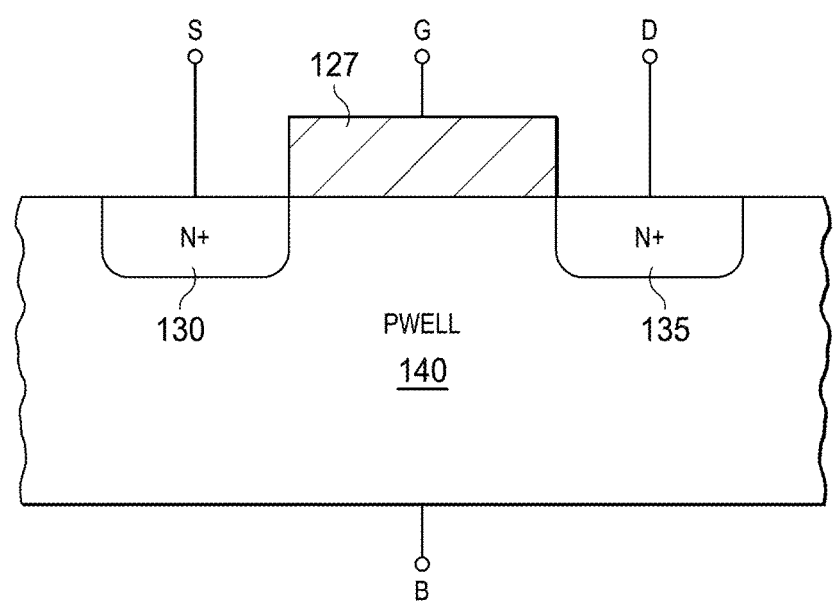
FIG. 2 shows an n-type metal oxide semiconductor (nMOS) transistor with a connection for a body bias in accordance with various examples.

FIG. 2 shows an example of an nMOS transistor that may be included in the logic circuit 125. As shown, the nMOS transistor has a gate 127, a source 130, and a drain 140. The source and drain regions may comprise negatively doped silicon, rich in electrons. A gate terminal (G) is connected to the gate regions and source (S) and drain (D) terminals are connected to the source and drain regions, respectively. A pwell 140 (also referred to as the "body" or "bulk") is formed in the substrate of the transistor and includes p-doped silicon. A connection B is shown connected to the body.

The region between the source 130 and the drain 135 is normally non-conducting. To make an n-channel transistor conducting, a positive voltage (Vgs) must be applied to the gate 127 relative to the source 130 that is greater than the threshold voltage of the transistor. The threshold voltage of a metal oxide semiconductor field effect transistor (e.g., nMOS, pMOS) is affected by the voltage which is applied to the back contact (body). The voltage difference between the body and the source, $V_{BS}$ changes the width of the depletion layer and therefore also the voltage across the oxide due to the change of the charge in the depletion region. This results in a difference in threshold voltage which equals the difference in charge in the depletion region divided by the oxide capacitance. The threshold voltage of the transistor is generally proportional to the square root of the body to source voltage.

Figure 3:
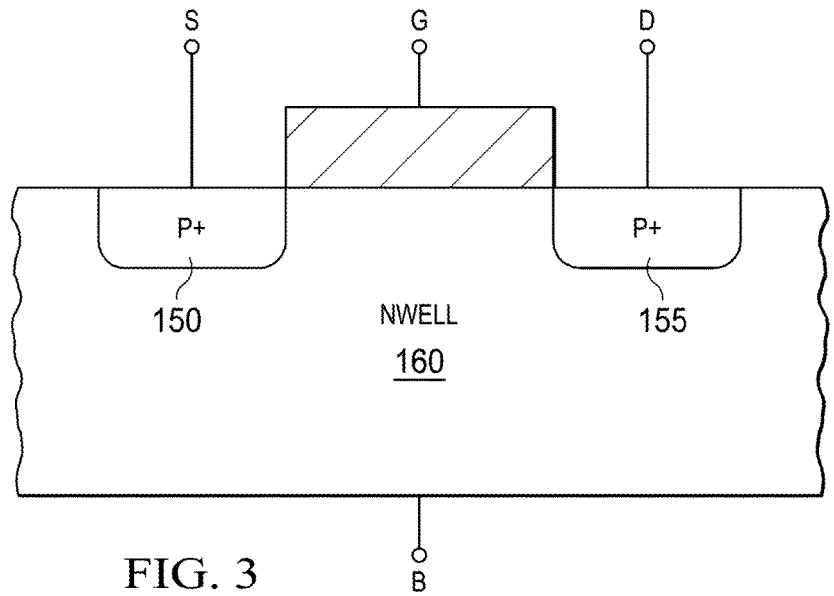
FIG. 3 shows a p-type metal oxide semiconductor (pMOS) transistor with a connection for a body bias in accordance with various examples.

FIG. 3 shows a similar schematic of a pMOS transistor. The schematic of the pMOS transistor is similar to that of the MOS transistor, except that the source 150 and drain 155 are positively doped regions, rich in holes rather than electrons. The body 160 is n-doped.

The circuit logic 125 includes one or more nMOS transistors and/or one or more pMOS transistors. That is, the logic circuit 125 may have only a single nMOS transistor or multiple nMOS transistors, with no pMOS transistors. Alternatively, the logic circuit 125 may have only a single pMOS transistor or multiple pMOS transistors, with no nMOS transistors. Further still, the logic circuit may have a mix of nMOS and pMOS transistors. The VBBPW voltage generated by the body bias generator 118 may be applied to some or all of the bodies of the nMOS transistors (pwell 140) in FIG. 2. Similarly, the VBBNW voltage generated by the body bias generator 118 may be applied to some or all of the bodies of the pMOS transistors (nwell 160) in FIG. 3.

Figure 4:
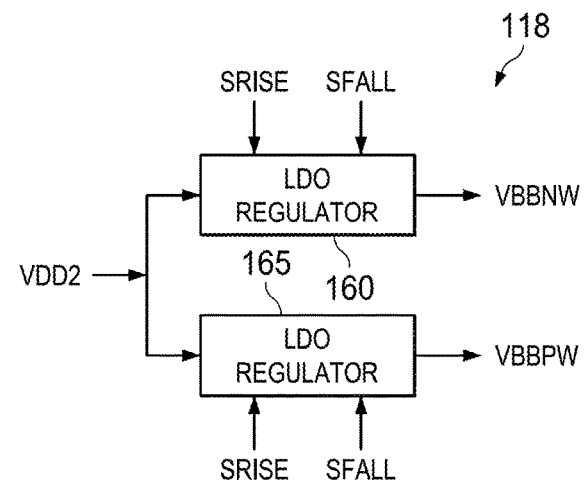
FIG. 4 shows an example of a body bias generator in accordance with various embodiments.

FIG. 4 shows an example of an implementation of the body bias generator 118. In this example, the body bias generator 118 includes a plurality of low voltage dropout (LDO) regulators 160, 165. The voltage rise and fall slew rates of the LDO regulators can be programmed via the SRISE and SFALL signals, which may be generated by controller 110 as the programming signals noted above. The LDO regulator 160 generates the VBBNW voltage to bias the bodies of the pMOS transistors in the logic circuit 125, and the LDO regulator 165 generates the VBBPW voltage for biasing the bodies of the nMOS transistors. Each LDO regulator receives an input voltage VDD2 and generates an output voltage (VBBNW, VBBPW) which is provided to the transistor body connections as explained above. Each LDO regulator 160, 165 can be programmed to generate any desired voltage within a given range of voltages. Further, the slew rate for the LDO regulator to change from one voltage level output to another can be controlled as well by the SRISE and SFALL signals generated by the controller 110.

FIG. 5 shows a timeline illustrating the operation of the logic circuit 125. The logic circuit may have periodic episodes in which the logic circuit transitions to and operates in an active mode 170 during which the logic circuit 125 is configured to perform an activity. When not in an active mode, the logic circuit 125 may be in a standby mode 171 which may include a low power mode in which the logic circuit 125 does very little, if anything. For example, the logic circuit 125 may be an IoT type device and generally be in a low power standby mode 171 most of the time, and then when needed (e.g., according to a schedule or based on an interrupt, sensor signal, or other event) transition to the active mode 170.

FIG. 6 shows an example of how the body bias voltage (e.g., VBBNW, VBBPW) are controlled via forward body bias (FBB) and/or reverse body bias (RBB). Raising the NMOS body bias voltage represents forward body biasing the NMOS and raising the PMOS body bias voltage represents reverse body biasing the PMOS. Further lowering the NMOS body bias voltage represents reverse body biasing the NMOS, while lowering the PMOS bulk voltage represents forward body biasing the PMOS. In some embodiments, the NMOS and PMOS devices are either all forward body biased or reverse body biased, although a mixture of FBB and RBB is possible as well.

During the active mode 170, the body bias voltages are controlled such that for NMOS devices and PMOS devices, the devices are forward body biased. This means that the body bias voltages are increased for NMOS devices and decreased for PMOS devices. As such, level 182 represents FBB for NMOS and PMOS devices to force the threshold voltage for the transistors to a relatively low level to thereby permit the transistors to switch on and off relatively quickly. Following each active mode 170, the controller 110 causes the body bias generator 118 to cause the FBB on the devices to slowly ramp down (184) to reduce or minimize the energy loss that would otherwise result had the body bias voltages ramped down more quickly. In some embodiments, the controller 110 is configured to cause the body bias generator 118 to discharge the bodies of the transistors over a time period that is greater than 50% of a time period of the standby mode. The time period of the standby mode in FIG. 5 is shown as T1. Thus, in some embodiments, the transistor bodies are discharged over a time period that is at least 50% of T1. In other embodiments, the controller 110 may cause the body bias generator to discharge the bodies of the transistors over a time period that is greater than 75% of the time period T1 of the standby mode.

Leading up to the next active mode 170, the controller 110 may cause the forward body biases to increase (increased bulk voltage on an NMOS and decreased bulk voltage on a PMOS) more quickly (182) than during the discharge phase. For example, the controller 110 may cause the body bias generator 118 to ramp up from a low state to voltage level 182 over a time period that is approximately 10% of the standby time period T1. Thus, in the example of FIG. 6, the controller 110 causes the FBB's to ramp up relatively quickly and ramp down relatively slowly.

In the example of FIG. 7, the controller 110 causes the body bias generator 118 to ramp up the FBB's (190)

relatively slowly and ramp down the FBB's (194) relatively quickly. This embodiment reduces or minimizes the energy dissipation as wasted heat during the body bias charge phase but not during the body bias discharge phase. The controller 110 can cause the body bias generator 118 to charge the bodies of the transistors over a time period that is greater than 50% of a time period T1 of the standby mode. In other embodiments, the controller 110 may cause the body bias generator to charge the bodies of the transistor over a time period that is greater than 75% of the time period T1 of the standby mode.

FIG. 8 shows an example in which the charging (200) and discharging (204) of the transistor bodies occur relatively slowly to reduce the wasted heat production while changing the body bias voltages during both the charge and discharge phases. For example, The FBB's may be ramped down (204) under control by the controller 110 for a time period approximately equal to 50% of the standby time period (T1), and also may be ramped up (200) for a time period approximately equal to 50% of the standby time period.

The explanation above with regard to FIGS. 6-8 discussed increasing slowly/quickly the FBB on the NMOS and PMOS devices. The same principles may be applied with regard to reverse body biasing of the devices, that is, decreasing the RBB leading up to the active modes 170 and increasing the RBB during the standby modes.

In some embodiments, the controller 110 can cause the body bias generator 118 to ramp up or down the body bias voltages over a time period that is at least 10% of the time period T1 of the standby mode 171.

Figure 9:
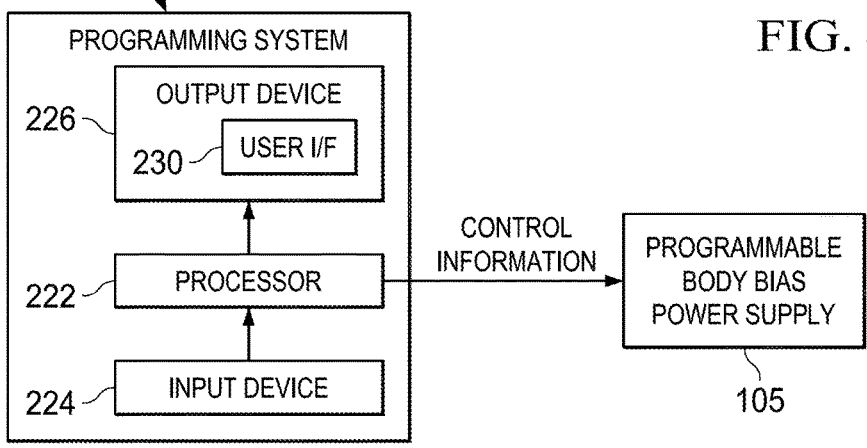
FIG. 9 shows an example of a programming system usable to program the programmable body bias power supply in accordance with various embodiments.

In some embodiments, the body bias power supply 105 is programmable. That is, the power supply can be programmed to cause the body bias voltages to be ramped up and/or down at a desired rate. FIG. 9 illustrates an embodiment in which a programming system 220 can be coupled (via a wired or wireless connection) to the programmable body bias power supply 105. A processor 222 in the programming system 220 can transfer control information to the programmable body bias power supply 105 for storage in storage 114 (FIG. 1). The control information may comprise body bias wave shape parameters 114 that define the slopes of the body bias voltages, VBBNW and VBBPW, generated by the body bias generator 118.

In some embodiments, the control information programmed into the programmable body bias power supply 105 by the programming system 220 also may include multiple sets of body bias voltage slope data for ramping up and/or down the body bias voltages under different conditions. For example, a temperature sensor 126 (FIG. 1) may be included in or adjacent the logic circuit 125 for monitoring the temperature of the logic circuit. A temperature signal from the temperature sensor 126 may be provided to, and monitored by, the controller 110 in the programmable body bias power supply 105. Based on the temperature reading, the controller 110 may select a particular set of body bias voltage slope values to control the slopes of the body bias voltages.

The programming system 220 also may include an input device 224 and an output device 226 to permit a user to control the programming of the programmable body bias power supply 105. The input device 224 may include a keyboard, mouse, or other type of input device, and the output device 226 may include a display. The processor 222 222 couples to the input device 224 and the output device 226. The programming system 220 may be a computer, tablet device, or any other type of computing device capable of being coupled to the programmable body bias power supply 105.

A user interface 230 such as a graphical user interface (GUI) may be implemented on the output device 226. Through the GUI, a user is able to specify, calculate, control, or otherwise indicate control information that includes or pertains to body bias wave shape parameters. Such information then can be downloaded by the processor 222 into the storage 112 in the power supply 105.

Figure 10:
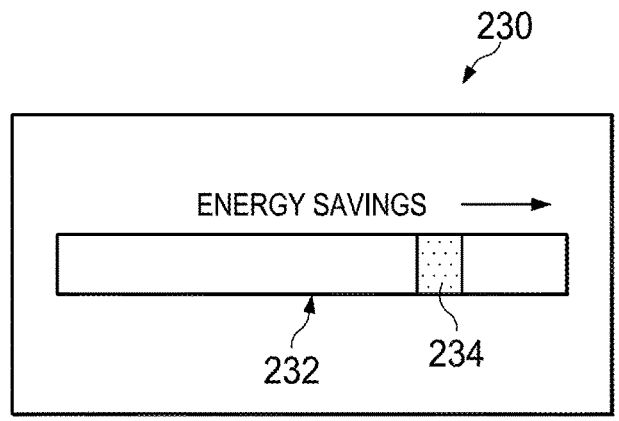
FIG. 10 shows a graphical user interface by which a user can control the operation of the programmable body bias power supply in accordance with various embodiments.

FIG. 10 shows an example of the user interface 230. In this example, the user interface includes a graphical slider 232 with a slider control 234 that can be moved by the user interacting with the input device 224 (e.g., a mouse). The graphical slider 232 can be moved left and right. Movement of the slider to the right prioritizes energy savings and movement of the slider to the left deprioritizes energy savings. Prioritizing energy savings will cause either the programming system 220 or the controller 110 of the programmable body bias power supply 105 to compute body bias wave shape parameters that cause the body bias voltages to ramp up and/or down at a slower rate thereby reducing wasted energy dissipation as explained above. Deprioritizing energy savings by moving the graphical slider 232 to the left will cause either the programming system 220 or the controller 110 of the programmable body bias power supply 105 to compute body bias wave shape parameters that cause the body bias voltages to ramp up and/or down at a faster rate to reduce leakage current through the transistors.

Figure 11:
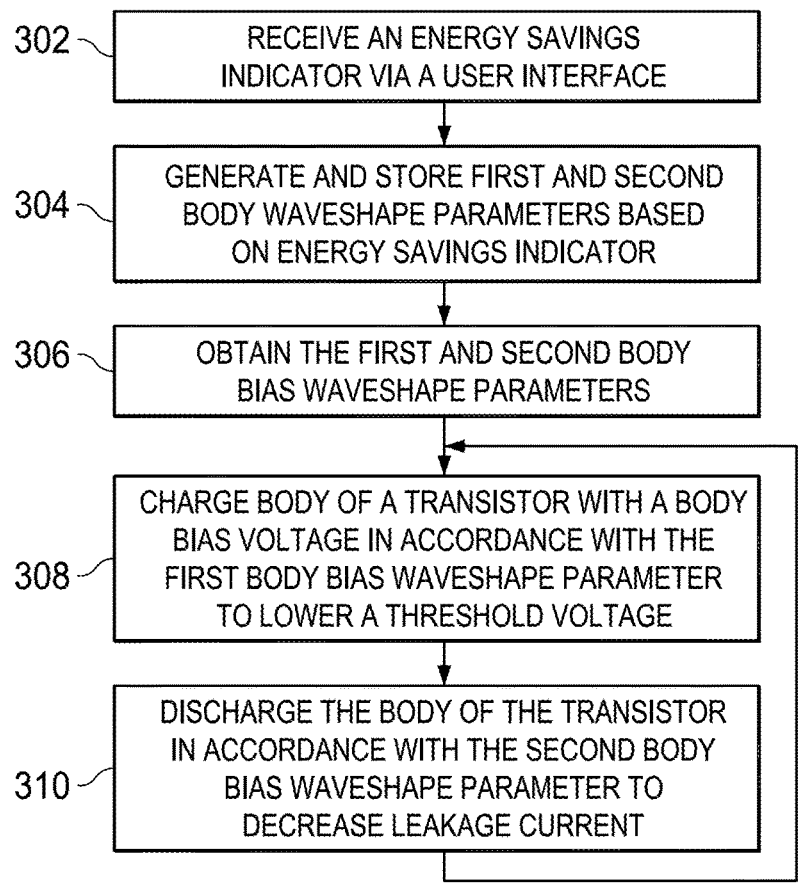
FIG. 11 shows a method operating the programmable body bias power supply in accordance with various embodiments.

FIG. 11 shows a method that can be implemented in accordance with various embodiments. The operations may be performed in the order shown or in a different order. Further, two or more of the operations may be performed in parallel rather than sequentially.

At 302, the method includes receiving an energy savings indicator via a user interface (e.g., user interface 230). The energy savings indicator may be a slider position as in the example of FIG. 10, a value typed in or selected by a user form a drop-down menu or other type of list, or any other way to specify an indication of energy savings. The energy savings indicator may be received by the processor 222 of the programming system 220 and/or received, through the programming system 222, by the controller 110 of the programmable body bias power supply 105.

At 304, the method includes generating and storing first and second body wave shape parameters based on the energy savings indicator. The first body wave shape parameter may define or may be usable to define the slope for ramping up the body bias voltage leading up to an active mode, while the second body wave shape parameter may define or may be usable to define the slope for ramping down the body bias voltage following an active mode. The generation of the first and second body wave shape parameters may include calculations to convert control information to body bias wave shape parameters to actually waveshape the slopes of the body bias voltages, VBBNW and VBBPW. The particular calculations are application specific. The body bias wave shape parameters may be slew rates for ramping up and down the body bias voltages. The generation of the first and second body wave shape parameters may be performed by the processor 222 in the programming system 220 and the generated parameters may then be stored in the power supply 105. Alternatively, the generation of the first and second body wave shape parameters may be performed by the controller 110 in the programmable body bias power supply 105.

At 306, the controller 110 in the programmable body bias power supply 105 may retrieve the first and second body bias wave shape parameters from storage 112 and use them in operations 308 and 310. At 308, the transistor body(ies) are charged by the body bias generator 118 with a body bias voltage in accordance with the first body bias wave shape parameter to lower the threshold voltage of the transistors. The transistor bodies may be charged up in this regard leading up to an active mode. At 310, the transistor body(ies) are discharged by the body bias generator 118 in accordance with the second body bias wave shape parameter to increase the threshold voltage of the transistors. The transistor bodies may be discharged in this regard following expiration of an active mode (i.e., at the beginning of the subsequent standby mode). Control is shown looping back to operation 308 so as to indicate that the repetition of the active and standby modes as shown in FIG. 5 can occur with the appropriate slopes of the body bias voltages.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method, comprising:
   obtaining first and second body bias slope parameters, each slope parameter defining, at least in part, a slope of a body bias voltage signal;
   charging a body of a transistor with a body bias voltage signal in accordance with the first body bias slope parameter to lower a threshold voltage of the transistor; and
   discharging the body of the transistor in accordance with the second body bias slope parameter to decrease leakage current of the transistor.

2. The method of claim 1 further comprising receiving the energy savings indicator via a user interface and generating the first and second body slope parameters based on the energy savings indicator.

3. The method of claim 2 further comprising storing the first and second body slope parameters in a storage device, and wherein obtaining the first and second body bias slope parameters comprises retrieving the first and second body bias slope parameters from the storage device.

4. The method of claim 1 wherein the first body bias slope parameter is different than the second body bias slope parameter.

5. A system, comprising:
   a programmable body bias power supply, the programmable body bias power supply includes storage for body bias waveshape parameters, a controller, and a body bias generator; and
   logic coupled to the programmable body bias power supply, the logic comprising a transistor that includes a body connection;
   wherein the controller is configured to cause the body bias generator to generate a body bias signal to be provided to the body connection of the transistor, and wherein a slope of the body bias signal is programmable based on the body bias waveshape parameters stored in the storage.

6. The system of claim 5, wherein:
   the body bias waveform parameters include a first body bias slope parameter and a second body bias slope parameter;
   the controller is configured to cause the body bias generator to ramp up or down the body bias signal in accordance with the first body bias slope parameter; and
   the controller is configured to cause the body bias generator to discharge the body of the transistor at a rate dependent on the second body bias slope parameter.

7. The system of claim 6 wherein, during a discharge of the body of the transistor, the body of the transistor is discharged through the programmable body bias power supply.

8. The system of claim 6 wherein first body bias slope parameter is different than the second body bias slope parameter.

9. The system of claim 6 wherein the rate at which the body of the transistor is discharged is lower than a rate at which the body bias generator is caused to ramp or down the body bias signal.

10. The system of claim 6 wherein the rate at which the body of the transistor is discharged is higher than a rate at which the body bias generator is caused to ramp or down the body bias signal.

11. The system of claim 6 wherein:
    the logic is configured to operate in a plurality of active modes during which the logic is configured to perform an activity and a standby mode between successive active modes; and
    the controller is configured to cause the body bias generator to discharge the body of the transistor over a time period that is greater than 50% of a time period of the standby mode.

12. The system of claim 11 wherein the controller is configured to cause the body bias generator to discharge the body of the transistor over a time period that is greater than 75% of the time period of the standby mode.

13. The system of claim 11 wherein the first body bias slope parameter causes the controller to cause the body bias generator to ramp up or down the body bias signal over a time period that is at least 10% of the time period of the standby mode.

14. The system of claim 5, wherein the programmable body bias power supply includes a plurality of sets of body bias voltage slope data, and the controller is configured to select one of the sets of the body bias voltage slope data to control the slope of the body bias signal.

15. The system of claim 14 further comprising a temperature signal, wherein the controller is configured to select one of the sets of the body bias voltage slope data based on a sensor signal from the sensor.

16. A programmable body bias power supply, comprising:
    storage for body bias timing values;
    a body bias generator; and
    a controller coupled to the storage and the body bias control network;
    wherein the controller is configured to retrieve the body bias timing values and to cause the body bias generator to generate a body bias signal to be provided to a body connection of a transistor, and wherein a slope of the body bias signal is configured by the controller based on the body bias timing values stored in the storage.

17. The programmable body bias power supply of claim 16, wherein:
    the body bias timing values include a first body bias timing value and a second body bias timing value;
    the controller is configured to cause the body bias generator to ramp up or down the body bias signal in accordance with the first body bias timing value; and the controller is configured to cause the body bias generator to discharge a body of the transistor at a rate dependent on the second body bias timing value.

18. The programmable body bias power supply of claim 7 wherein first body bias timing value is different than the second body bias timing value.

19. The programmable body bias power supply of claim 18 wherein the rate at which the body of the transistor is discharged is lower than a rate at which the body bias generator is caused to ramp or down the body bias signal.

20. The programmable body bias power supply of claim 17 wherein the rate at which the body of the transistor is discharged is higher than a rate at which the body bias generator is caused to ramp or down the body bias signal.

* * * * *